US007449871B2

(12) United States Patent
Talbot et al.

(10) Patent No.: US 7,449,871 B2
(45) Date of Patent: Nov. 11, 2008

(54) SYSTEM FOR SETTING AN ELECTRICAL CIRCUIT PARAMETER AT A PREDETERMINED VALUE

(75) Inventors: Andrew David Talbot, Chievely (GB); Keith Jones, Pinner (GB)

(73) Assignee: Intel Corporation, Santa Clara, CA (US)

(*) Notice: Subject to any disclaimer, the term of this patent is extended or adjusted under 35 U.S.C. 154(b) by 305 days.

(21) Appl. No.: 10/545,856

(22) PCT Filed: Feb. 25, 2004

(86) PCT No.: PCT/GB2004/000748

§ 371 (c)(1),
(2), (4) Date: Aug. 16, 2005

(87) PCT Pub. No.: WO2004/077191

PCT Pub. Date: Sep. 10, 2004

(65) Prior Publication Data

US 2006/0145753 A1 Jul. 6, 2006

(30) Foreign Application Priority Data

Feb. 25, 2003 (GB) ................................ 0304275.1

(51) Int. Cl.
*G05F 3/08* (2006.01)
*H03B 5/26* (2006.01)
*H03L 7/099* (2006.01)

(52) U.S. Cl. ...................... 323/312; 327/159; 331/36 C

(58) Field of Classification Search ................. 323/312, 323/315–317, 353–354; 331/36 C, 141; 338/215; 327/403–404, 407–408, 538, 543, 327/159, 156, 150, 147; 341/121, 135
See application file for complete search history.

(56) References Cited

U.S. PATENT DOCUMENTS

| | | | | |
|---|---|---|---|---|
| 4,587,477 | A | 5/1986 | Hornak et al. | |
| 5,352,934 | A * | 10/1994 | Khan | 327/538 |
| 5,381,083 | A | 1/1995 | Inamori et al. | |
| 5,608,348 | A | 3/1997 | Kearney et al. | |
| 6,201,379 | B1 | 3/2001 | Mercer et al. | |
| 6,265,859 | B1 * | 7/2001 | Datar et al. | 323/315 |
| 6,563,387 | B2 * | 5/2003 | Hirano et al. | 331/11 |
| 6,744,277 | B1 * | 6/2004 | Chang et al. | 326/37 |

OTHER PUBLICATIONS

International Search Report, PCT/GB2004/000748, date of mailing Jun. 4, 2004.
International Preliminary Examination Report, PCT/GB2004/000748, date of completion Jun. 23, 2005.
Official search report from GB 0304275.1, Jun. 17, 2003.

* cited by examiner

*Primary Examiner*—Jeffrey L. Sterrett
*Assistant Examiner*—Harry Behm
(74) *Attorney, Agent, or Firm*—Blakely, Sokoloff, Taylor & Zafman LLP

(57) ABSTRACT

A system is disclosed for setting an electrical circuit parameter at a predetermined value. The system comprises a first electrical component having a first electrical parameter associated therewith. Sensing means generate a control signal indicative of the value of the first electrical parameter. A second electrical component has a second electrical parameter associated therewith, the value of which has a predetermined relation to the value of the first electrical parameter. Adjustment means receive the control signal generated by the sensing means; and, in response to the control signal being indicative that the electrical circuit parameter is not at the predetermined value, selectively connects or disconnects at least one further electrical component to or from the second electrical component thereby to provide said predetermined value.

17 Claims, 7 Drawing Sheets

| Predefined Resistance (Ω) | Error (%) | Actual Resistance (Ω) | Required Capacitance (F) | Change (%) |
|---|---|---|---|---|
| 1 | -50 | 0.5 | 2 | 100 |
| 1 | -40 | 0.6 | 1.67 | 67 |
| 1 | -30 | 0.7 | 1.43 | 43 |
| 1 | -20 | 0.8 | 1.25 | 25 |
| 1 | -10 | 0.9 | 1.11 | 11 |
| 1 | 0 | 1 | 1 | 0 |
| 1 | 10 | 1.1 | 0.91 | -9 |
| 1 | 20 | 1.2 | 0.83 | -17 |
| 1 | 30 | 1.3 | 0.77 | -23 |
| 1 | 40 | 1.4 | 0.71 | -29 |
| 1 | 50 | 1.5 | 0.67 | -33 |

SYSTEM FOR SETTING AN ELECTRICAL CIRCUIT PARAMETER AT A PREDETERMINED VALUE

CROSS-REFERENCES TO RELATED APPLICATIONS

This application is a national stage application under 35 U.S.C. 371 of, and claims a benefit of priority under 35 U.S.C. 365(a) and/or 35 U.S.C. 365(b) from, copending international application PCT/GB2004/000748, filed Feb. 25, 2003, now WO 2004/077191, published Sep. 10, 2004, the entire contents of which are hereby expressly incorporated herein by reference for all purposes. This application is related to, and claims a benefit of priority under one or more of 35 U.S.C. 119(a)-119(d) from foreign patent application GB 0304275.1, filed Feb. 25, 2003, the entire contents of which are hereby expressly incorporated herein by reference for all purposes.

This invention relates to a system for setting an electrical circuit parameter at a predetermined value.

It is common for electrical circuits to require, for proper operation, an electrical circuit parameter which is set at a predetermined value. For example, an electrical circuit may require a reference current which is set at a predetermined fixed value.

Conventional techniques for setting an electrical parameter at a predetermined value can be inefficient. Component fabrication errors can affect the accuracy of circuit components which determine the value of the electrical parameter. In the case of CMOS analogue circuits, for example, a conventional method for generating a reference current is to impress a fixed voltage across an on-chip resistor. However, due to processing tolerance limitations in fabricating the resistor, its actual value is likely to differ from its predefined or intended resistance value, and so the resultant reference current will differ from its intended value. In addition, temperature and/or voltage supply variations can affect the resistance value during the lifetime of the chip.

The invention relates to a system for setting an electrical circuit parameter at a predetermined value, the system comprising: means comprising (i) a first electrical component having a first electrical parameter associated therewith, and (ii) sensing means arranged to generate a signal indicative of the value of said first electrical parameter; a second electrical component having a second electrical parameter associated therewith, the value of which has a predetermined relation to the value of the first electrical parameter; and adjustment means arranged to receive the signal generated by the sensor, and in response thereto, to maintain the value of the second electrical parameter, or a further electrical parameter derived therefrom, at a substantially predetermined value.

According to a first aspect of the invention, there is provided a system for setting an electrical circuit parameter at a predetermined value, the system comprising: a first electrical component having a first electrical parameter associated therewith; sensing means arranged to generate a control signal indicative of the value of said first electrical parameter; a second electrical component having a second electrical parameter associated therewith, the value of which has a predetermined relation to the value of the first electrical parameter; and adjustment means arranged to receive the control signal generated by the sensing means, and in response to the control signal being indicative that the electrical circuit parameter is not at the predetermined value, to selectively connect or disconnect at least one further electrical component to or from the second electrical component thereby to provide said predetermined value.

The electrical circuit parameter may be electrical current, the second electrical component being a current source connected to an output path. In this case, the or each further electrical component will be a current source, the predetermined value of current being set by selectively connecting or disconnecting the or each further current source to the output of the second electrical component. Alternatively, the electrical circuit parameter may be resistance, the second electrical component being a resistive component. In this case, the or each further electrical component will also be a resistive component, the predetermined resistance value being set by selectively connecting or disconnecting the or each further resistor in series or in parallel with the second electrical component.

According to a second aspect of the invention, there is provided a system for setting an electrical circuit parameter at a circuit output at a predetermined value, the system comprising: a first electrical component having a first electrical parameter associated therewith; sensing means arranged to generate a control signal indicative of the value of said first electrical parameter; a second electrical component having a second electrical parameter associated therewith, the value of which has a predetermined relation to the value of the first electrical parameter; and adjustment means arranged to receive the control signal generated by the sensing means, and in response to the control signal being indicative that the electrical circuit parameter at the circuit output is not at the predetermined value, to selectively connect or disconnect at least one further electrical component to or from an output path of the second electrical component thereby to provide said predetermined value at the circuit output.

The above systems can provide automatic trimming and adjustment of the electrical parameter at the circuit output. Since there is a predetermined relation between the first and second components, an indication of the value of the first component will provide a corresponding indication of the value of the second component. This means that any parameter deriving from the second component can be modified to meet a predetermined value based on the indication of the first component value. The indication might comprise a measure of the deviation of the first component value from its predefined value.

In the preferred embodiment described below, the first and second electrical parameters are the same, although this is not essential.

The second electrical component may be a current source arranged to supply current to the circuit output, the adjustment means being arranged to selectively connect or disconnect at least one further current source to or from the circuit output in order to maintain the total current at the circuit output at a substantially predetermined value. The current sources may be provided by resistors or switchable transistors. In the case of switchable transistors, the transistors may be arranged in a current mirror configuration.

The control signal generated by the sensing means may be an n-bit digital code, n being an integer.

The adjustment means may include a memory on which is stored (i) a plurality of n-bit digital codes, each n-bit digital code being indicative of a different respective value of the first electrical parameter, and (ii) corresponding to each n-bit digital code, an m-bit digital code which is effective to selectively cause connection or disconnection of a predetermined number of further electrical components to or from the circuit output, m being an integer.

According to a third aspect of the invention, there is provided a system for setting a current signal at a circuit output at a predetermined value, the system comprising: a first resistive component; sensing means arranged to generate a control signal indicative of the resistance value of said first resistive component; a second resistive component providing a primary current source to the circuit output, the resistance value of the second resistive component having a predetermined relation to the resistance value of the first resistive component; and adjustment means arranged to receive the control signal generated by the sensing means, and in response to the control signal being indicative that the current signal at the circuit output is not at the predetermined value, to selectively connect or disconnect at least one secondary current source to or from the circuit output thereby to set the total current supplied to the circuit output substantially at the predetermined value.

The system may further comprise an oscillator, the operating frequency of which is dependent on (a) the value of the first resistive component, and (b) a capacitor component associated with the oscillator, the control signal generated by the sensing means being derived from the difference between the operating frequency of the oscillator and a reference frequency. The control signal generated by the sensing means may be effective to set the capacitance of the capacitor component at such a value that the operating frequency of the oscillator is modified to be substantially the same as the reference frequency.

The control signal generated by the sensing means may be an n-bit digital code, n being an integer. The adjustment means may include a memory on which is stored (i) a plurality of n-bit digital codes, each n-bit digital code being indicative of a different respective value of the first resistive component, and (ii) corresponding to each n-bit digital code, an m-bit digital code which is effective to selectively connect or disconnect at least one secondary current source to or from the circuit output, m being an integer.

According to a fourth aspect of the invention, there is provided a system for setting a resistance source at a predetermined resistance value, the system comprising: a first resistive component; sensing means arranged to generate a control signal indicative of the resistance of said first resistive component; a second resistive component, the resistance of which has a predetermined relation to the resistance of the first resistive component; and adjustment means arranged to receive the control signal generated by the sensing means, and in response to the control signal being indicative that the resistance source is not at the predetermined value, to selectively connect or disconnect at least one further resistive component to or from the second resistive component thereby to provide said predetermined value of resistance.

The or each further resistive component can be connected in series and/or in parallel with the second resistive component.

As mentioned previously, the system has particular advantages when implemented on an IC chip where processing errors can affect the intended value of circuit components, and temperature and voltage supply variations can cause the value of predetermined parameters to vary.

According to a fifth aspect of the invention, there is provided a method of setting an electrical circuit parameter at a predetermined value, the method comprising: providing a first electrical component having a first electrical parameter associated therewith; providing a second electrical component having a second electrical parameter associated therewith, the value of which has a predetermined relation to the value of the first electrical parameter; generating a control signal indicative of the value of said first electrical parameter; and in response to the control signal being indicative that the electrical circuit parameter is not at the predetermined value, selectively connecting or disconnecting at least one further electrical component to or from the second electrical component thereby to provide said predetermined value.

The invention will now be described, by way of example, with reference to the accompanying drawings, in which:

FIG. 1*a* is a block diagram of a system for generating a reference bias current;

FIG. 1*b* is a block diagram representing part of an adjustment circuit used in the system shown in FIG. 1*a;*

Figure 1A:
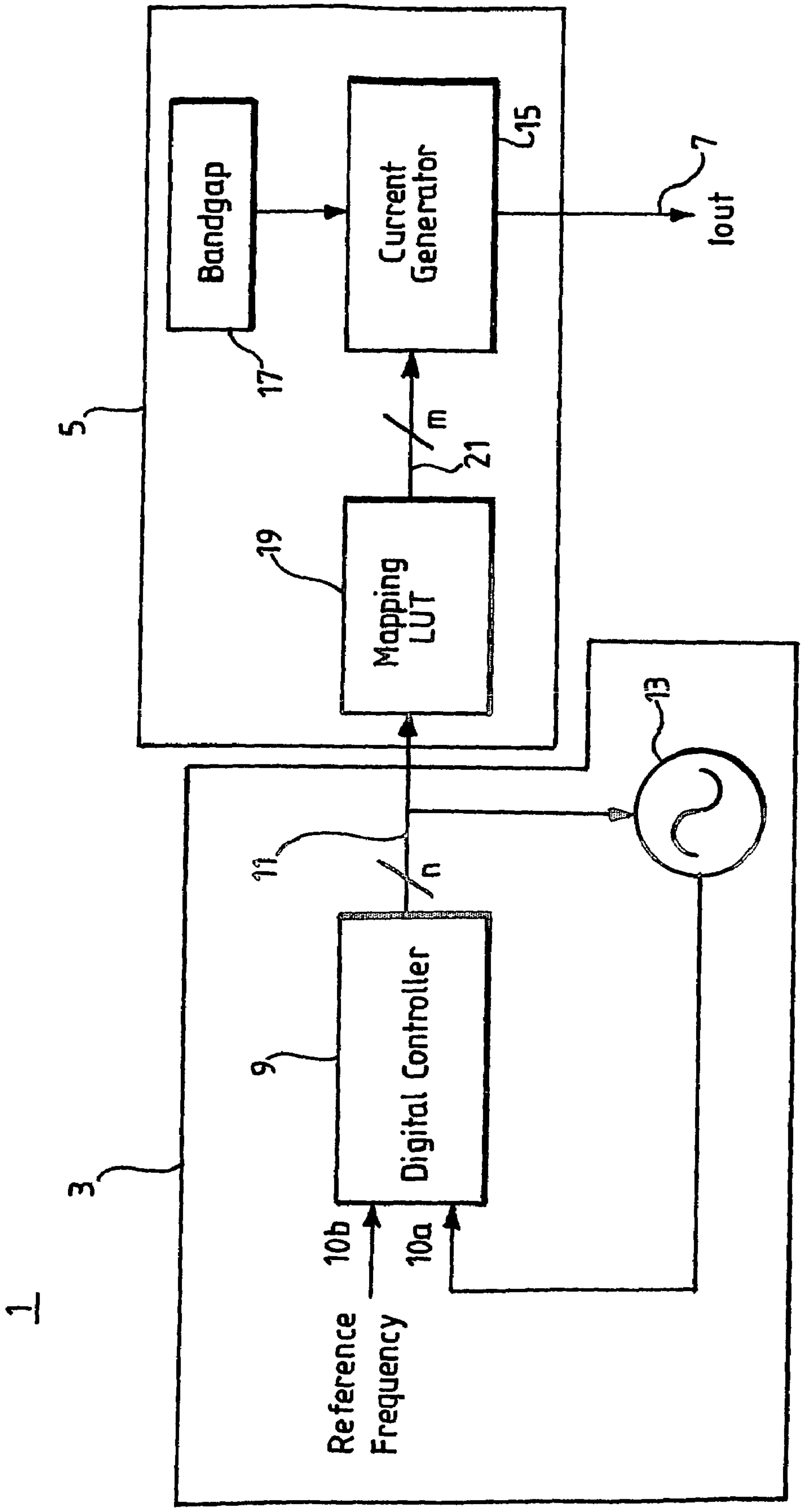
Figure 2:
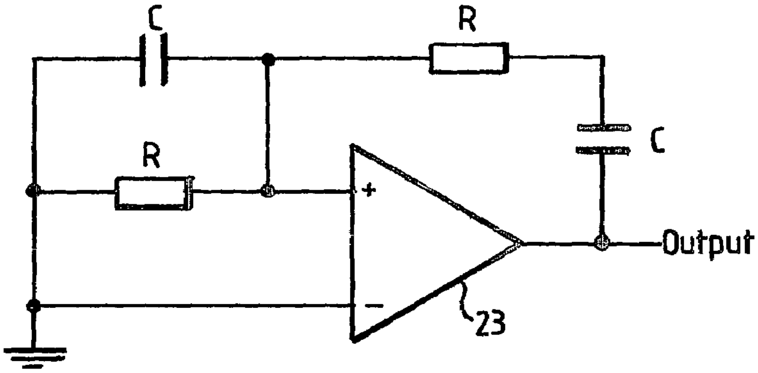
FIG. 2 is a circuit diagram of an exemplary oscillator used in the system shown in FIG. 1*a;*
Figure 5A:
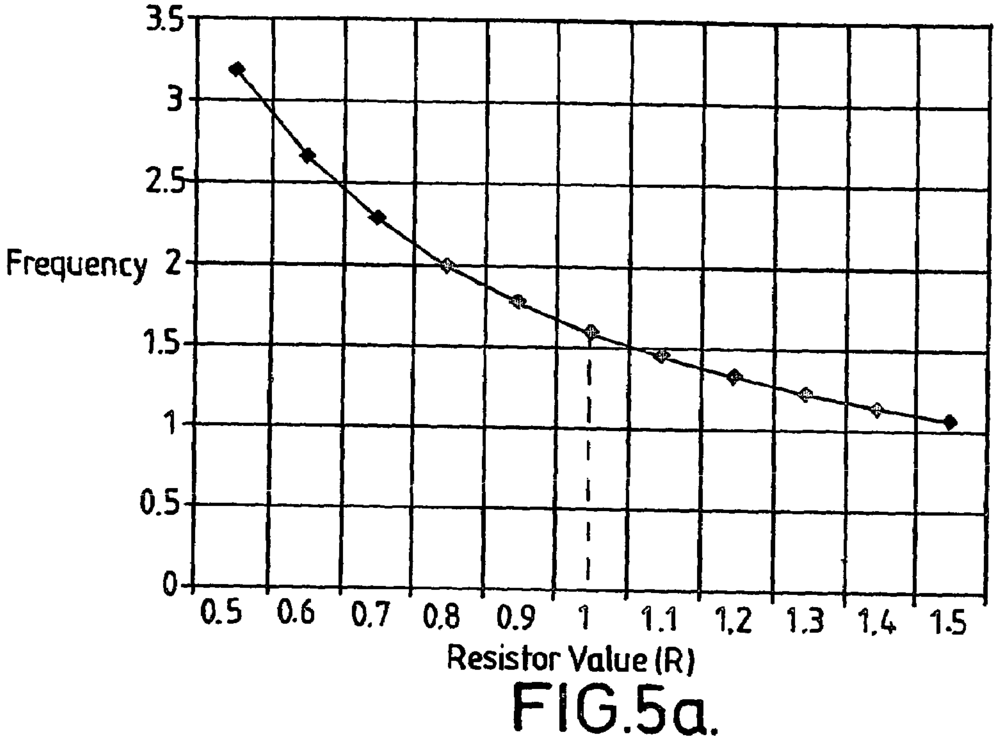
Figure 5B:
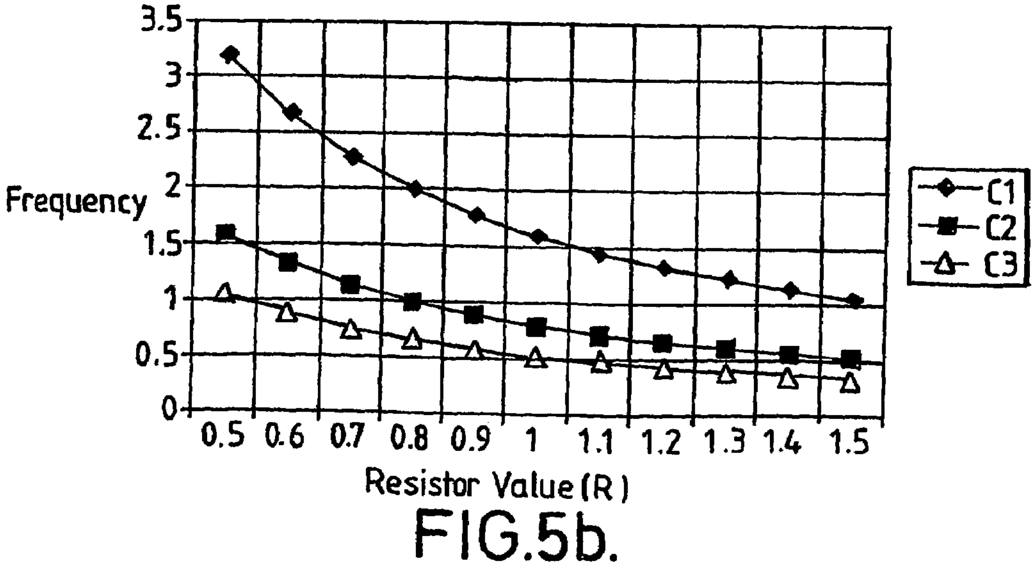
Figures 6, 7:
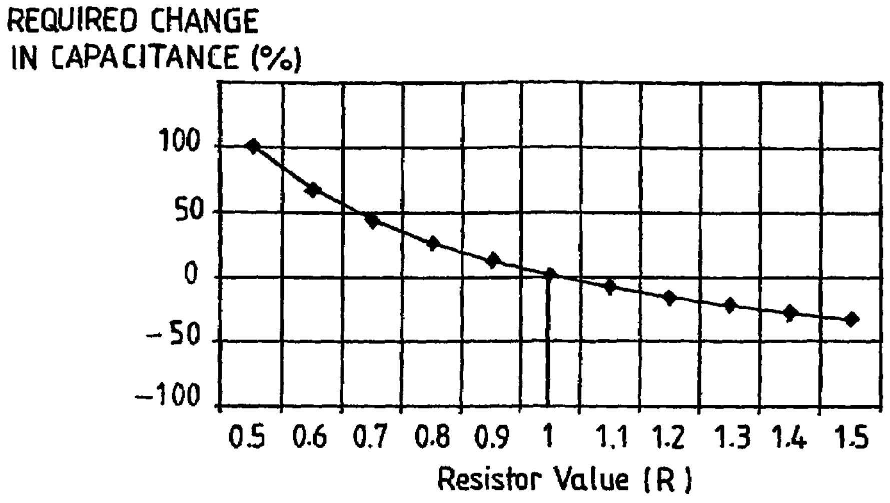
Figure 8:
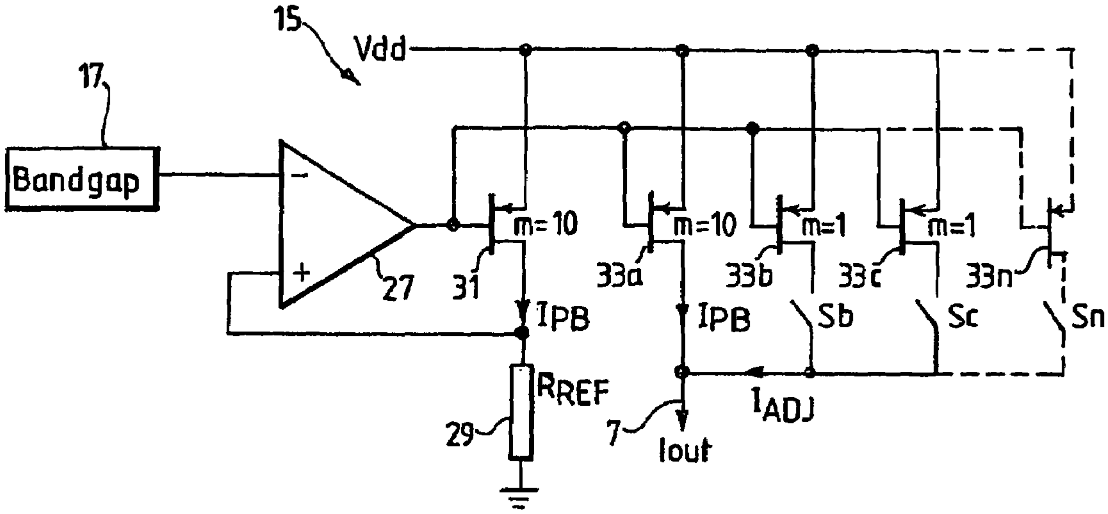

FIGS. 5*a* and 5*b* are graphs representing the relationship between varying resistance and the operating frequency of the oscillator represented in FIG. 2;

FIG. 6 is a graph representing the relationship between varying resistance and the required change in capacitance to maintain the oscillator frequency constant;

FIG. 7 is a table showing, in numerical form, the relationship between varying resistance and the required change in capacitance to maintain the oscillator frequency constant;

FIG. 8 is a schematic circuit diagram showing part of an adjustment circuit used in the system shown in FIG. 1*a;*

Figure 9:
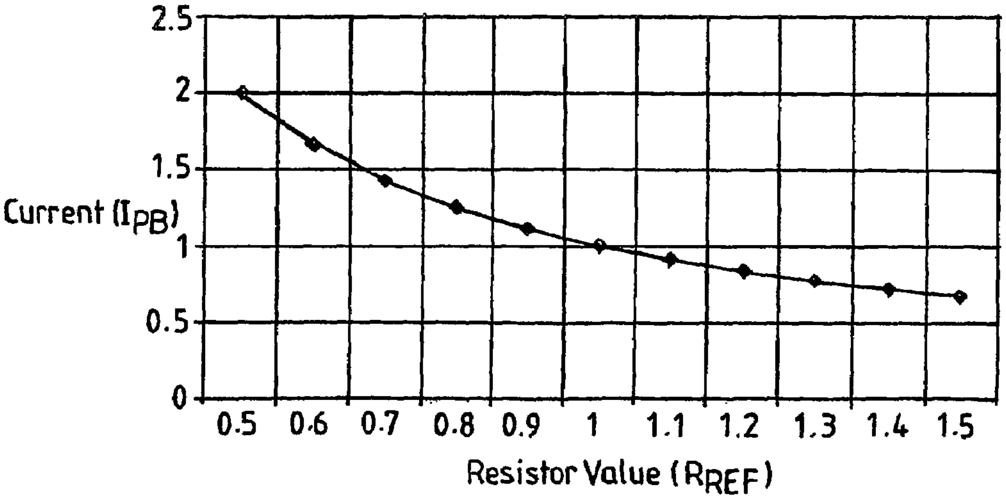
Figure 10:
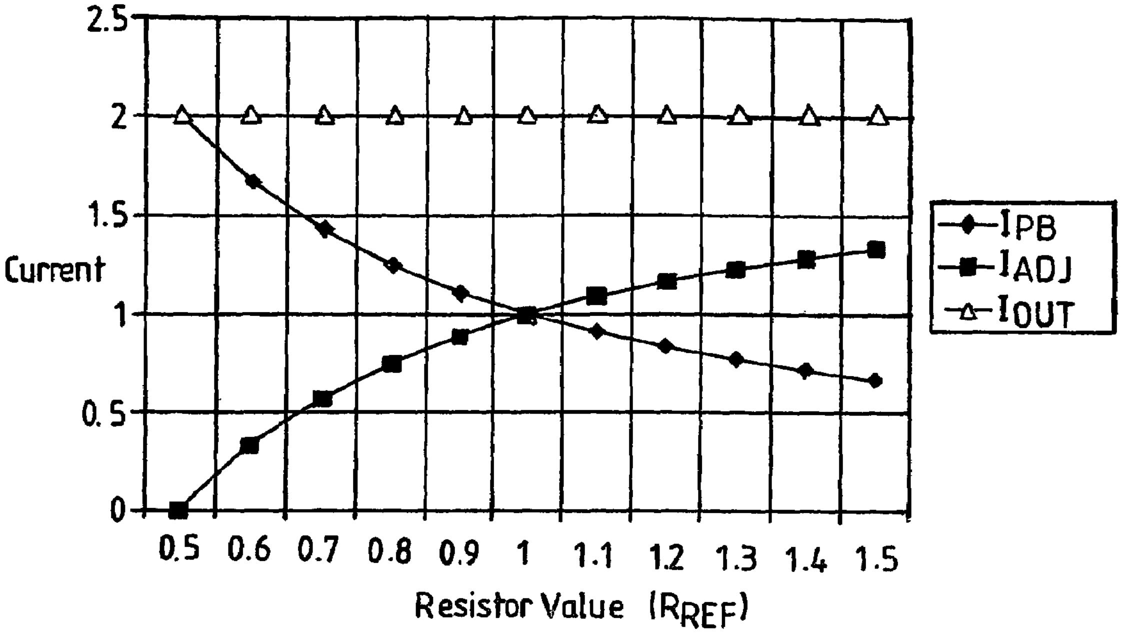
Figure 11:
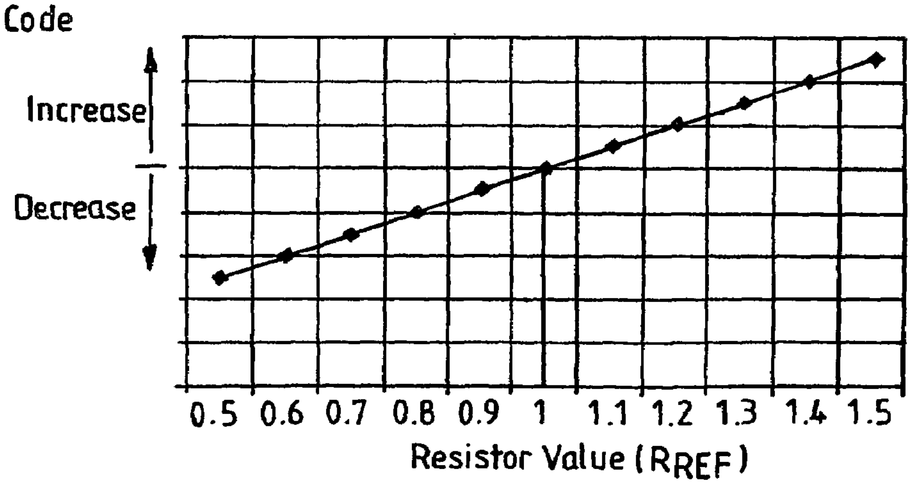
Figure 12:
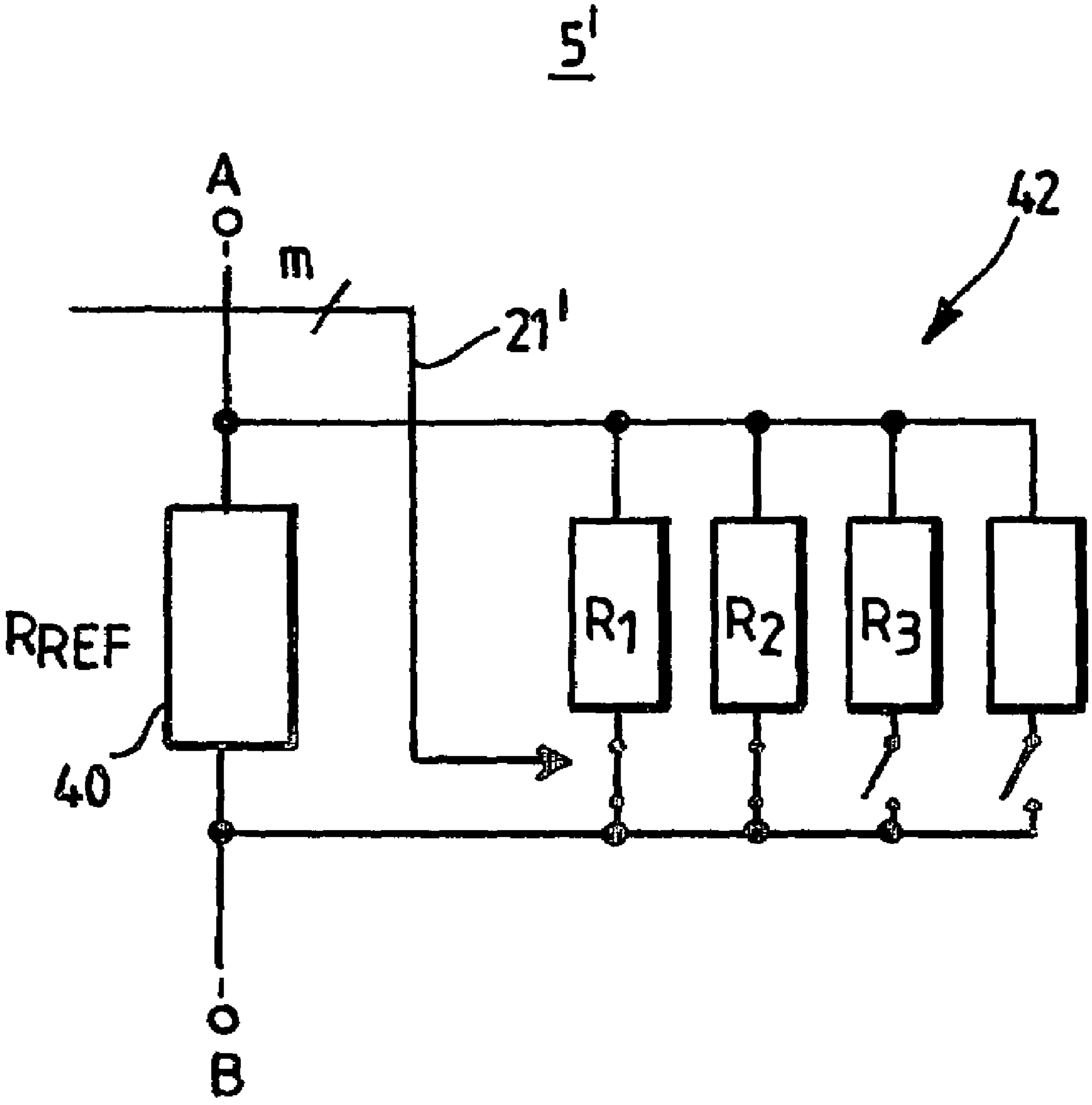

FIG. 9 is a graph representing the relationship between the varying resistance of an adjustment circuit resistor and the resultant current flowing through said resistor;

FIG. 10 is a graph representing the relationship between the resistance of the adjustment circuit resistor and the adjustment current required to set the output current at a substantially predetermined level;

FIG. 11 is a graph representing the relationship between the resistance of the adjustment circuit resistor and a digital code for adding or subtracting suitable amounts of adjustment current for setting the current output at a substantially predetermined level; and FIG. 12 is a block diagram representing part of an adjustment circuit used in a related system in accordance with the invention.

Referring to FIG. 1*a*, a system 1 for generating a substantially constant reference current '$I_{out}$' on an IC chip comprises a sensing circuit 3 and an adjustment circuit 5.

Figure 1B:
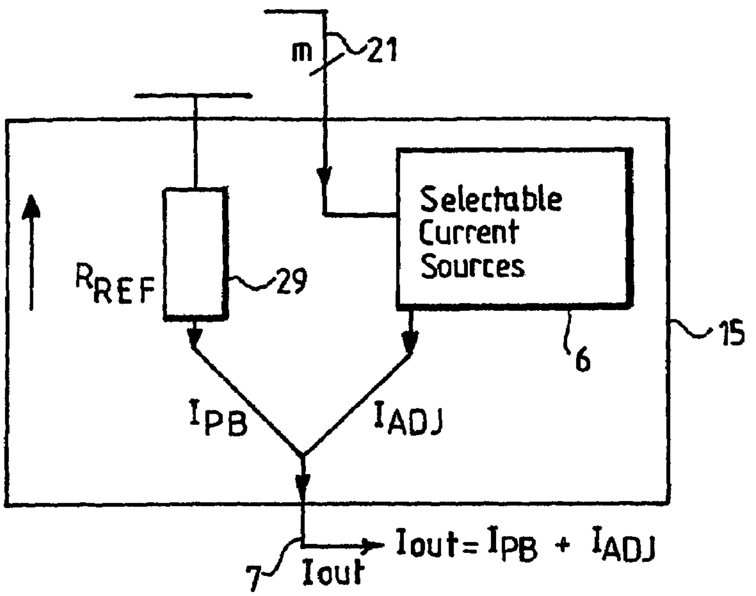

In overview, the adjustment circuit 5 is arranged to generate the reference current $I_{out}$ for output to an output line 7. The operation of the adjustment circuit 5 will be described fully below, but it will be noted that the basic components comprise a current generator 15, a bandgap generator 17, and a mapping LUT 19. Referring to FIG. 1*b*, which is a block diagram representation of the current generator 15, it will be seen that the current generator includes a reference resistor $R_{REF}$ 29 which generates a primary current $I_{PB}$ for output to the output line 7. As explained previously, due to limitations in forming on-chip resistors, such as $R_{REF}$ 29, the actual value of its resistance is likely to differ from its intended value. For this reason, the value of $I_{out}$ is not derived solely from $R_{REF}$ 29. Indeed, the total current $I_{out}$ on the output line 7 is made up of both the primary current $I_{PB}$, by use of the bandgap generator 17, and a secondary 'adjustment' current $I_{ADJ}$, which is generated using one or more selectable current sources 6. As will be described below, the adjustment current $I_{ADJ}$ can be increased or decreased in order to set and maintain the total current $I_{out}$ at a substantially constant level. The amount of adjustment current $I_{ADJ}$ generated is determined by a control signal from the sensing circuit 3. As will be explained, the sensing circuit 3 includes a further resistive component (not shown in FIG. 1*a*) the value of which has a predetermined relation to that of the reference resistor $R_{REF}$ 29. Accordingly, by deriving an indication of the resistance value in the sensing circuit 3, it is possible to determine (a) the corresponding value of $R_{REF}$ 29, and so the value of $I_{out}$ derived therefrom, and (b) the value of $I_{ADJ}$ required to set $I_{out}$ at the predetermined value.

The detailed arrangement and operation of the sensing circuit 3 and the adjustment circuit 5 will now be described.

Referring to FIG. 1*a*, the sensing circuit 3 comprises a digital controller 9 and an oscillator 13. The oscillator 13 is arranged in a feedback loop between the output of the digital controller 9, and a first input 10*a* of the digital controller. A second input 10*b* of the digital controller 9 receives a reference signal having a fixed reference frequency.

Referring to FIG. 2, it will be noted that the oscillator 13 is based on the well-known Wien Bridge oscillator configuration comprising an operational amplifier 23 and the illustrated network of capacitor elements "C" and resistors "R". The output frequency f of the oscillator 13 is given by:

$$f=1/(2\pi RC). \quad (1)$$

Figure 3:
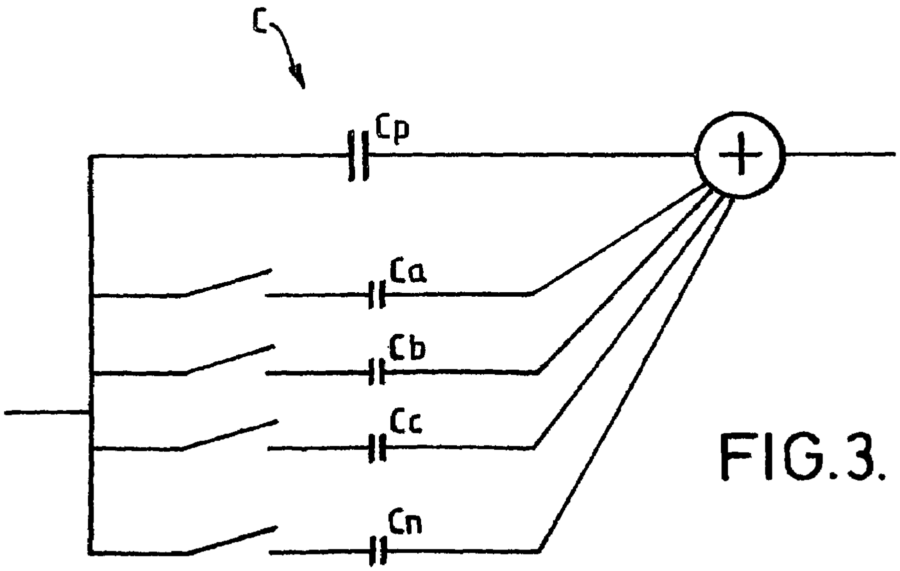
FIG. 3 is a schematic representation of a capacitor network used in the oscillator circuit shown in FIG. 2.

Each capacitor element C represented in FIG. 2 is actually formed of a number of separate capacitors. Referring to FIG. 3, each capacitor element C comprises a primary capacitor Cp and a plurality of switchable capacitors Ca-Cn arranged in such a way that the capacitance of each switchable capacitor Ca-Cn can be selectively added to the capacitance of the primary capacitor Cp. This is performed using an n-bit digital code, each bit of which determines whether or not the capacitance of a particular switchable capacitor Ca-Cn is added to that of the primary capacitor Cp. As will be explained further below, the n-bit digital code is generated by the digital controller 9 and is outputted on an n-bit control bus 11 which is connected to the oscillator 13 and to the adjustment circuit 5.

Each capacitor element C in the oscillator 13 is initially set to a first capacitance value by means of connecting approximately half of the switchable capacitors Ca-Cn to the primary capacitor Cp. It follows that the capacitance value of each capacitor element C can thereafter be increased, by changing the n-bit digital code to increase the number of switchable capacitors Ca-Cn connected to the primary capacitor Cp, or decreased, by changing the n-bit digital code to decrease the number of switchable capacitors connected to the primary capacitor. The purpose of enabling adjustment of each capacitor element C will become apparent in due course.

Figure 4:
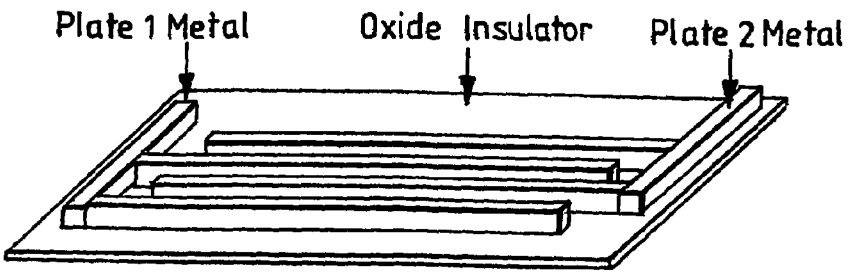
FIG. 4 shows the basic structure of a Metal-Oxide-Metal (MOM) capacitor component used in the capacitor network shown in FIG. 3.

The capacitors forming each capacitor element C are lithographically formed so that their respective capacitance value is very accurate and not prone to processing variations. For example, each capacitor Cp and Ca-Cn can be a metal-oxide-metal (MOM) capacitor having the finger-type structure shown in FIG. 4.

Each resistor R in the oscillator 13 is designed to have a predefined resistance value. However, as mentioned above, it is generally not possible to obtain precisely this predefined resistance value. In addition, variations in temperature and voltage supply levels will cause variations in resistance. Accordingly, the output frequency f of the oscillator 13 will vary as a function of the resistance value alone. The amount of frequency variation provides a useful indication of the actual resistance value of the oscillator resistors R. This variation is represented in FIG. 5*a* for which a nominal fixed capacitance value of 0.1 F is chosen for each capacitor element C of the oscillator 13. If we assume that the predefined resistance value is 1 Ω then the oscillator frequency f will be 1.59 Hz. If the oscillator frequency f is actually 2 Hz (a variation of +0.4 Hz) then it is possible to determine that the actual resistance value is approximately 0.8 Ω.

FIG. 5*b* shows the effect of modifying the capacitance of each capacitor element C by adding the switchable capacitors Ca-Cn to the primary capacitor Cp. In this case, C1 is the initial value of 0.1 F, C2 is 0.2 F and C3 is 0.3 F. Thus, across the range of resistance values, it is seen that the oscillator frequency f decreases as the capacitance value increases. It will be appreciated that a reduction in capacitance will cause the oscillator frequency f to increase.

Referring back to FIG. 1*a*, the reference frequency supplied to the second input 10*b* of the digital controller 9 is chosen so that it corresponds to the frequency f that would be generated by the oscillator 13 under ideal conditions, i.e. when the value of each oscillator resistor R equals its predefined value. This reference frequency can be calculated using equation (1) above. Thus, if we take example values in which the predefined resistance is 1 Ω and the initial capacitance of each capacitor element C is 0.1 F, the reference frequency should be set at 1.59 Hz.

The digital controller 9 is arranged to receive the output signal from the oscillator 13 at the first input 10*a*, and to compare the frequency f of the received signal with the reference frequency received at the second input 10*b*. In the event that the value of each resistor R is equal to its predefined resistance value (e.g. 1 Ω in the example given above) the oscillator 13 will generate a signal having a frequency f equal to that of the reference frequency. In this case, the digital controller 9 is arranged to maintain the n-bit digital code in its current state. Any difference between the reference frequency and the oscillator frequency f will indicate that the actual resistance of each oscillator resistor R is not equal to the predefined resistance. In this case, the digital code output from the digital controller 9 will be modified in the manner described below.

If the resistance of each resistor R in the oscillator 13 is below the predefined resistance value, the oscillator 13 will generate a signal having a frequency f above that of the reference frequency. In this case, the digital controller 9 is arranged to generate a modified n-bit digital code which causes the capacitance of each capacitor element C to increase to compensate for the difference between the value of each resistor R and the predefined resistance value. In other words, the digital controller 9 'switches in' additional switchable capacitors Ca-Cn so that the frequency f of the oscillator 13 equals that of the reference frequency.

Conversely, if the resistance of each resistor R is above the predefined resistance value, the oscillator 13 will generate a signal having a frequency f below that of the reference frequency. In this case, the digital controller 9 is arranged to generate a modified n-bit digital code which causes the capacitance of each capacitor element C to decrease to compensate for the difference between the resistance of each resistor R and the predefined resistance value. Specifically, the digital controller 9 outputs a modified n-bit digital code which disconnects one or more of the switchable capacitors Ca-Cn, already connected to the primary capacitor Cp, such that the frequency f of the oscillator 13 equals that of the reference frequency.

Since the n-bit digital code generated by the digital controller 9 increases or decreases the capacitance of each capacitor element C to compensate for a corresponding decrease or increase in resistance of each resistor R, it follows that the n-bit digital code so generated will change in inverse proportion to the resistance error of the oscillator resistors R. In other words, if the actual resistance value is below that of the predefined resistance value, the n-bit digital code will increase to compensate for the difference.

The capacitance values of the switchable capacitors Ca-Cn are chosen such that the n-bit digital code outputted from the digital controller 9 increases or decreases the capacitance of the capacitor elements C by the required factor to compensate for the corresponding resistance error. The graph of FIG. 6 represents the relationship between the detected resistance of each resistor R, and the change in capacitance required to maintain the oscillator frequency f constant. As the actual resistance value varies above and below the predefined resistance, the graph indicates the change in capacitance required to keep the oscillator frequency f constant (in this case, at 1.59 Hz). Based on this information, the digital controller 9 generates the required n-bit digital code to effect the required change in capacitance.

So, if the resistance value differs from the predefined value by +10% (i.e. 1.1 Ω) then a −9% change in capacitance (i.e. 0.91 F) is required to maintain the oscillator frequency constant. Thus, in the event of a 10% error in resistance, the digital controller 9 is configured to output an n-bit digital code which disconnects a suitable number of switchable capacitors Ca-Cn so that the total capacitance is reduced by −9%. If the resistance value differs from the predefined value by −10% (0.9 Ω) then an +11% change in capacitance (1.11 F) is required to maintain the oscillator frequency constant. Accordingly, in the event of a −10% error in resistance, the digital controller 9 is configured to output a digital code which connects a suitable number of switchable capacitors Ca-Cn such that the total capacitance is increased by 11%.

FIG. 7 shows, in numerical form, the relationship between resistance and required change in capacitance over a larger range of different resistance values.

In summary, therefore, the digital controller 9 is configured to generate an n-bit digital code which is indicative of the resistance value of the oscillator resistors R. More particularly, the n-bit digital code is indicative of the deviation in resistance from its predefined value. As well as being fed back to the oscillator 13, this n-bit digital code is supplied to the adjustment circuit 5. As will be discussed below, the adjustment circuit 5 utilises the n-bit digital code to set the reference bias current $I_{out}$ at a predetermined level, and thereafter to maintain $I_{out}$ substantially constant.

As mentioned above, the adjustment circuit 5 comprises a current generator 15, a bandgap generator 17 and a mapping ROM 19 which is connected to the current generator 15 by means of an m-bit data bus 21. The fixed bias current $I_{out}$ is supplied from the current generator 15 on the output line 7.

Referring to FIG. 8, which shows a circuit-level representation of the current generator 15, it will be seen that the current generator comprises an operational amplifier 27, the inverting input of which is connected to the bandgap generator 17. The bandgap generator 17 provides a very stable voltage source. The output of the operational amplifier 27 is connected to a first PMOS transistor 31 having a sizing of 10.

Connected to the source terminal of the first PMOS transistor 31 is the reference resistor RREF 29 through which the primary bias current IPB is generated. RREF 29 is formed using the same fabrication process used to form each oscillator resistor R. Accordingly, any error present in each oscillator resistor R will also be present in RREF 29. Furthermore, in this example at least, RREF 29 has the same predefined resistance value as each of the oscillator resistors R. It follows, therefore, that the values of the oscillator resistors R and RREF 29 will be the same. This will hold true even if post-fabrication effects, such as temperature or power supply variations, cause changes in the resistance values since errors in one resistor will track in the others.

The relationship between the resistance value of RREF 29 and the resulting value of IPB is represented in FIG. 9. The voltage across RREF 29 is assumed to be 1 volt in this case. It will be understood that the value of IPB is directly proportional to the value of RREF (in accordance with Ohm's law in which I=V/R).

Referring back to FIG. 8, it will be seen that a number of further PMOS transistors **33*a*-33*n* are supplied with the same gate voltage as the first PMOS transistor 31. Each of the further PMOS transistors 33*a*-33*n* is arranged as a current mirror such that the current flowing through each is a fraction of that flowing through the first PMOS transistor 31, the fraction depending on the relative size of the transistor. The first mirror transistor 33*a* has the same size as the first PMOS transistor, i.e. 10, and so the current flowing through this mirror transistor will equal IPB. The output of the first mirror transistor 33*a* is connected to the output line 7 on which the required fixed reference bias current $I_{out}$ is supplied. The remaining PMOS transistors (hereafter referred to as the 'fractional mirror transistors') 33*b*-33*n* have a size of 1 and so the current flowing through each will be equal to one-tenth of IPB. Each of the fractional mirror transistors 33*b*-33*n* is selectively connectable or disconnectable to or from the output line 7 by means of digital switches Sb-Sn arranged in the output paths of the fractional mirror transistors. The digital switches Sb-Sn are opened or closed in accordance with the m-bit digital code supplied from the mapping ROM 19 over an m-bit data bus 21**.

It follows that the total reference current $I_{out}$ supplied to the output line 7 is made up of IPB plus a selected number of one-tenth fractions of IPB. As described previously, the summed value of these one-tenth fractions is referred to as 'IADJ'. Therefore, the value of $I_{out}$ can be controlled by choosing which of the fractional mirror transistors **33*b*-33*n* are connected to the output line 7 using the m-bit digital code. It is the function of the mapping Look-Up Table (LUT) 19 to ensure that the total bias current $I_{out}$ is set and maintained at the predetermined value by means of generating an m-bit code suitable for connecting or disconnecting the appropriate number of fractional mirror transistors 33*b*-33*n* to the output line 7**.

The operation of the mapping LUT 19 will now be described.

As described previously, the output from the digital controller 9 of the sensing circuit 3 is an n-bit digital code which is indicative of the deviation of the resistance value of the oscillator resistors R from their predefined resistance value. Since there is a predetermined relation between the value of the oscillator resistors R, and that of the reference resistor RREF 29, the n-bit digital code which indicates whether the value of $I_{out}$ is at its predetermined value. The mapping LUT 19 is programmable and stores a list of all possible variations of the n-bit digital code. Corresponding to each n-bit code is stored an m-bit digital code arranged to cause connection or disconnection of the appropriate number of fractional mirror transistors **33*b*-33*n*** required to establish the required reference bias current $I_{out}$ at the predetermined level.

In the case where the n-bit digital code indicates that the resistance of the oscillator resistors R equals the predefined value, the resistance of Rref 29 will also equal its predefined value. In this state, the mapping LUT 19 is arranged to generate an m-bit digital code which connects a suitable number of fractional mirror transistors **33*b*-33*n* to the output line 7** in order to establish the required reference bias current Iout.

Thus, the value of $I_{out}$ will be equal to IPB plus a predetermined number of one-tenth fractions of IPB. In this state, it is preferable that approximately half of the fractional mirror transistors 33b-33n are connected to the output line 7.

In the event that the n-bit digital code indicates that the value of the oscillator resistors R is above or below the predefined value, a different m-bit digital code is output from the mapping LUT 19 in order to connect or disconnect the appropriate number of fractional mirror transistors 33b-33n to keep $I_{out}$ constant. In this case, the m-bit digital code will be directly proportional to the resistance value indicated in the n-bit code.

FIG. 10 is a graph which is useful for understanding the operation of the adjustment circuit 5. In this case, the required value of $I_{out}$ is set at 2 A and the predefined value of RREF 29 is set at 1 Ω. The bandgap generator outputs a stable voltage of 1 v.

In the event that the n-bit digital code from the sensing circuit 3 indicates that the actual value of RREF 29 is equal to its predefined value of 1 Ω, the value of IPB will be 1 A. Accordingly, the mapping ROM 19 will generate an m-bit digital code which connects ten fractional mirror transistors 33b-33n to the output line 7. In this case, the value of IADJ will equal 1 A and so the total current $I_{out}$ will be 2 A. In the event that the n-bit digital code indicates that the actual value of Rref 29 is above 1 Ω, the value of IPB will be less than 1 A. In this case, the mapping LUT 19 is programmed to output a different m-bit digital code which connects additional fractional mirror transistors 33b-33n to the output line 7 to increase the value of $I_{ADJ}$ such that $I_{out}$ remains at 2 A. Conversely, in the event that the n-bit digital code indicates that the actual value of RREF 29 is below 1 Ω, the mapping LUT 19 is programmed to output an m-bit digital code which disconnects some fractional mirror transistors 33b-33n from the output line 7 in order to reduce the value of IADJ such that $I_{out}$ remains at 2 A.

FIG. 11 shows the relationship between the resistance deviation from the predefined value, and the resulting change in m-bit code output from the mapping LUT 19.

In the above-described embodiment, although the oscillator resistors R and the reference resistor RREF 29 have the same predefined value, this need not be the case. What is significant is that there is a predetermined relation between the oscillator resistors R and the reference resistor RREF 29. If the resistors R and RREF 29 do not have the same predefined value, suitable scaling can be performed in the mapping ROM 19 to ensure that the appropriate m-bit digital code is output in response to a particular n-bit digital code.

The above-described system 1 is particularly useful for generating a fixed reference current '$I_{out}$' for use with high quality analogue CMOS circuitry.

The above-described system 1 can be modified to set one or more other circuit parameters at a predetermined value. For example, FIG. 12 shows part of an alternative adjustment circuit 5' which is arranged to provide a predetermined resistance source having resistor terminals A-B. The alternative adjustment circuit 5' can be substituted for the adjustment circuit shown in FIG. 1 and comprises a reference resistor $R_{REF}$ 40 and four switchable resistors $R_1$-$R_4$ which can be selectively connected and disconnected in parallel with the reference resistor $R_{REF}$. As will be appreciated, the total resistance $R_{EFF}$ is given by the formula:

$$1/R_{EFF}=1/R_{REF}+1/R_1+1/R_2+1/R_3+1/R_4 \quad (2).$$

In this case, the n-bit digital code received from the sensing circuit 3 is used to connect or disconnect one or more of the further resistors $R_1$-$R_4$ in order to set and maintain the total resistance $R_{EFF}$ substantially at the predetermined level. It will be appreciated that further resistors (not shown) can also be selectively connected or connected in series with the reference resistor 40. The adjustment circuit 5' can be connected, for example, within the feedback loop of a filter circuit.

The invention claimed is:

1. A system for setting an electrical circuit parameter at a circuit output at a predetermined value, the system comprising:

a first electrical component having a first electrical parameter associated therewith;

sensing means arranged to generate a control signal indicative of a value of said first electrical parameter;

a second electrical component having a second electrical parameter associated therewith, the value of which has a predetermined relation to the value of the first electrical parameter;

adjustment means arranged to receive the control signal generated by the sensing means, and in response to the control signal being indicative that the electrical circuit parameter at the circuit output is not at the predetermined value and the control signal being generated independently of any deviation of the circuit output, to selectively connect or disconnect at least one further electrical component to or from an output path of the second electrical component thereby to provide said predetermined value at the circuit output; and an oscillator having an operating frequency dependent on (a) the value of the first resistive component, and (b) a capacitor element associated with the oscillator, the control signal generated by the sensing means being derived from the difference between the operating frequency of the oscillator and a reference frequency and is effective to set the capacitance of the capacitor element at such a value that the operating frequency of the oscillator is modified to be substantially the same as the reference frequency.

2. A system according to claim 1, wherein the second electrical component is connected to an output path of the circuit.

3. A system according to claim 1, wherein the first and second electrical parameters are the same.

4. A system according to claim 1, wherein the second electrical component is a current source arranged to supply current to the circuit output, the adjustment means being arranged to selectively connect or disconnect at least one further current source to or from the circuit output in order to maintain the total current at the circuit output at a substantially predetermined value.

5. A system according to claim 4, wherein the current sources are provided by resistors.

6. A system according to claim 1, wherein the control signal generated by the sensing means is an n-bit digital code, n being an integer.

7. A system according to claim 6, wherein the adjustment means includes a memory on which is stored (i) a plurality of n-bit digital codes, each n-bit digital code being indicative of a different respective value of the first electrical parameter, and (ii) corresponding to each n-bit digital code, an m-bit digital code which is effective to selectively cause connection or disconnection of a predetermined number of further electrical components to or from the circuit output, m being an integer.

8. A system according to claim 1, wherein a deviation in the second electrical parameter is tracked by a deviation in the first electrical parameter.

9. A system according to claim 1, wherein the system is self adjusting.

10. A system according to claim 9, wherein the system is automatically self adjusting.

11. A system for setting a current signal at a circuit output at a predetermined value, the system comprising:

a first resistive component;

sensing means arranged to generate a control signal indicative of the resistance value of said first resistive component;

a second resistive component providing a primary current source to the circuit output, the resistance value of the second resistive component having a predetermined relation to a resistance value of the first resistive component;

adjustment means arranged to receive the control signal generated by the sensing means, and in response to the control signal being indicative that the electrical current at the circuit output is not at the predetermined value, to selectively connect or disconnect at least one secondary current source to or from the circuit output thereby to set the total current supplied to the circuit output at a substantially predetermined value; and an oscillator having an operating frequency dependent on (a) the value of the first resistive component, and (b) a capacitor element associated With the oscillator, the control signal generated by the sensing means being derived from the difference between the operating frequency of the oscillator and a reference frequency and is effective to set the capacitance of the capacitor element at such a value that the operating frequency of the oscillator is modified to be substantially the same as the reference frequency.

12. A system according to claim 11, wherein the capacitor element comprises a number of fixed capacitor components.

13. A system according to claim 12, wherein each capacitor component is lithographically formed.

14. A system according to claim 11, wherein the control signal generated by the sensing means is an n-bit digital code, n being an integer.

15. A system according to claim 14, wherein the adjustment means includes a memory on which is stored (i) a plurality of n-bit digital codes, each n-bit digital code being indicative of a different respective value of the first resistive component, and (ii) corresponding to each n-bit digital code, an m-bit digital code which is effective to selectively connect or disconnect at least one secondary current source to or from the circuit output, m being an integer.

16. A method of setting an electrical circuit parameter at a circuit Output at a predetermined value, the method comprising:

providing a first electrical component having a first electrical parameter associated therewith;

providing a second electrical component connected to an output path of the circuit output and having a second electrical parameter associated therewith, the value of which has a predetermined relation to a value of the first electrical parameter generating a control signal indicative of the value of said first electrical parameter and the electrical parameter at the circuit output and the control signal being generated independently of any deviation of the circuit output; and in response to the control signal being indicative that the electrical circuit parameter is not at the predetermined value, selectively connecting or disconnecting at least one further electrical component to or from the second electrical component thereby to provide said predetermined value, wherein the control signal is generated by being derived from a difference between an operating frequency of an oscillator and a reference frequency and is effective to set a capacitance at such a value that the operating frequency of the oscillator is modified to be substantially the same as the reference frequency.

17. A method according to claim 16, wherein the method includes the step of automatically trimming the electrical circuit parameter at the circuit output.

* * * * *